RE 25963

Jan. 30, 1962 W. F. HEINE ETAL 3,019,396

AUTOMATIC VOLUME CONTROL TRANSISTOR CIRCUIT ARRANGEMENT

Filed Oct. 9, 1959

INVENTORS
Wolfgang F. Heine
Kalju Meri
BY
Kenyon & Kenyon
ATTORNEYS

United States Patent Office 3,019,396

Patented Jan. 30, 1962

3,019,396

AUTOMATIC VOLUME CONTROL TRANSISTOR CIRCUIT ARRANGEMENT

Wolfgang F. Heine, Huntington Station, and Kalju Meri, Elmhurst, N.Y., assignors to Mohawk Business Machines Corporation, Brooklyn, N.Y., a corporation of Maryland Filed Oct. 9, 1959, Ser. No. 845,407
7 Claims. (Cl. 330—28)

The present arrangement relates generally to automatic volume control (AVC) or gain control (AGC) circuits, and more particularly to an automatic volume control circuit for a transistor amplifier operating in the audio frequency range.

It is common practice to provide radio receivers with an AVC system to maintain the carrier voltage at the detector at a substantially constant level. In receivers employing vacuum tubes, this is usually accomplished by biasing the grids of the radio-frequency, intermediate-frequency and converter tubes negatively with a direct voltage derived by rectifying the carrier signal. An increase in carrier signal will raise the negative bias and thereby tend to counteract the increased signal by reducing the amplification. In this way variations in signal strength due to fading or on tuning from strong to weak carriers are smoothed out.

An AVC action is ordinarily obtained by deriving from a diode rectifier and filter a direct voltage proportional to the amplitude of the carrier at the diode input but free of the modulation component. The time constants of the filter circuit are adjusted so that the lowest modulation frequencies do not reach the AVC output. At the same time, the time constants are small enough so that the rectified bias will follow fairly rapid changes in carrier amplitude.

In vacuum tube circuits, the tubes controlled by the AVC system are generally of the variable-mu type in order to minimize the possibility of cross-modulation. The recent advent of transistor circuits has created certain difficulties in conjunction with AVC systems, for transistors having characteristics equivalent to variable-mu tubes are not available. It is therefore the conventional practice in AVC transistor circuits to apply the direct-bias to the transistor so as to shift the operating point thereof toward the cutoff region. While this arrangement is feasible if applied to transistorized high-frequency carrier amplifiers, it leads to unbearable distortion when applied to an audio-signal amplifier.

Accordingly, it is the principal object of this invention to provide a novel, distortion-free automatic-volume-control system for a transistorized amplifier.

More specifically, it is an object of the invention to provide an AVC system for a transistor amplifier operating in the audio range which does not require an amplifying tube or transistor having curved or variable-mu transfer characteristics and which does not entail changes in direct-current level.

Also an object of the invention is to provide an AVC transistor amplifier circuit of efficient and reliable design in which attack and decay times may be readily adjusted, the arrangement generating no popping sounds and introducing no distortion, unless severely overloaded.

Still another object of the invention is to provide in an AVC circuit a transistor device which acts as a variable impedance responsive to the amplitude of the signal, the impedance action being effected without a direct current applied to the collector of the transistor device.

For a better understanding of the invention as well as other objects and further features thereof, reference is made to the following detailed specification to be read in conjunction with the annexed drawing whereby like components in the several figures are identified by the reference numerals.

Figure 1:
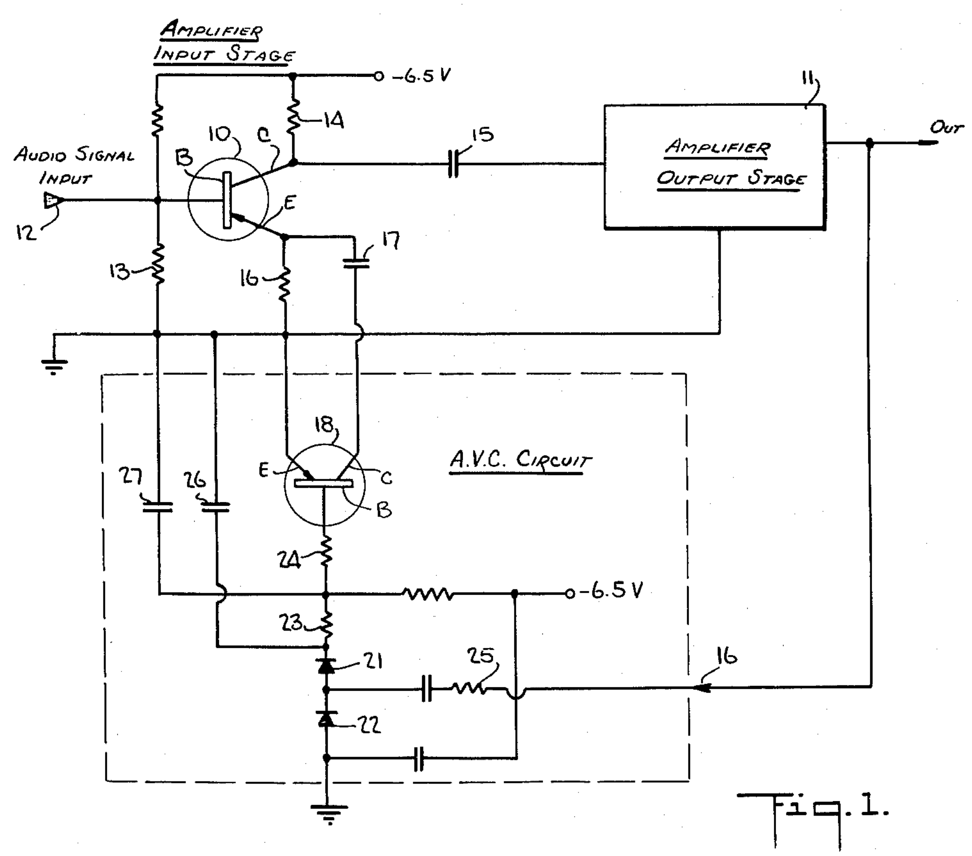
FIG. 1 is a schematic diagram of a preferred embodiment of the invention.

Referring now to the drawing, and more particularly to FIG. 1, there is shown a transistorized audio-amplifier, including a first input stage provided with a transistor 10, the output of this stage being fed to succeeding stages of conventional design represented by block 11. It is to be understood that the invention is applicable to all known types of transistors such as the N and P types, provided of course that the electrodes are appropriately biased.

The input signal is applied at terminal 12 connected to the base B of transistor 10, the base being coupled to ground through a resistor 13. A negative bias is applied to the collector C of transistor 10 through resistor 14. The output of the first stage is taken from the collector C of transistor 10 and applied through coupling capacitor 15 to the input of the succeeding stage 11. The emitter E of transistor 10 is connected to ground through resistor 16.

In a conventional transistor amplifier circuit, resistor 16 would be by-passed for audio frequency currents by a condenser connected thereacross. If the by-pass condenser is omitted, a substantial loss in gain will be experienced, the loss being in the order —30 db. This fact is exploited in the present invention by providing a by-pass condenser 17 which is connected across resistor 16 through a variable control impedance constituted by a second transistor 18. Condenser 17 is connected to the collector C of control transistor 18, the emitter thereof being grounded.

In accordance with the invention the impedance of control transistor 18 is varied as a function of the volume level of the audio signal in the amplifier so as to compensate for changes in level and thereby automatically to control the gain. This is accomplished by applying a portion of the output of the final amplifier stage 11 to the control transistor 18 through a rectifier circuit constituted by diodes 21 and 22 which are serially connected between ground and the base B of transistor 18 through resistor 23 in series with resistor 24.

The signal from the output of the output stage is applied to the rectifier circuit at the junction of diodes 21 and 22 through resistor 25, and a negative bias for base B of the control transistor 18 relative to emitter E is applied at the junction of resistor 23 and 24. A filtering of the rectified signal is effected by means including capacitors 26 and 27 connected between ground and the opposing ends of resistor 23.

The control transistor 18 will act as a variable impedance controlling the gain in the amplifying transistor 10 without any direct-current changes in transistor 10 and without any transients in the signal amplified. The value of condenser 26 is chosen to obtain the desired decay time and the value of resistor 25 is chosen to secure the desired attack time.

Figure 2:
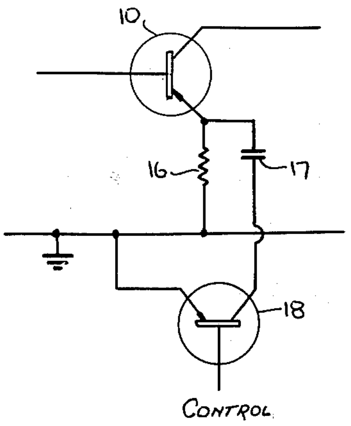
FIG. 2 is a simplified form of the invention.
Figure 3:
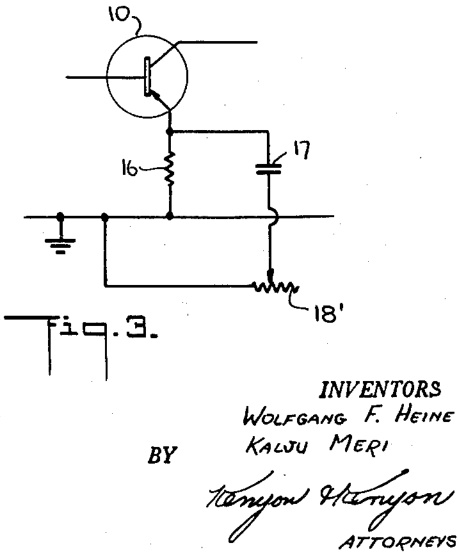
FIG. 3 is the equivalent electrical circuit of FIG. 2.

It is to be noted, in connection with FIG. 2, that as the conductance of control transistor 18 is varied by the rectified and filtered signal, it acts only to adjust the degree of by-pass introduced by condenser 17 and it does not affect direct-current flow in transistor 10. This is equivalent to the action of variable resistor 18 in FIG. 3, which serves to adjust the by-pass reactance path across resistor 16 without changing direct current flow through the resistor.

Since the speed of automatic-volume-control (say 10 milliseconds) is in the same order as the amplified frequencies in an audio amplifier, a change in direct current flow in resistor 16 as a result of the regulating action would appear as an unwanted signal in the audio output, the unwanted signal being heard as a popping sound. With the present invention such unwanted signals are obviated.

It is also significant that the transistor 18 acts as a variable impedance device without there being a direct current voltage applied to the collector C. The condenser 17 is interposed between the collector C of transistor 18 and the direct current circuit.

While there has been shown what is considered to be a preferred embodiment of the invention, it is to be understood that many changes may be made therein without departing from the essential scope of the invention as defined by the claims.

What is claimed is:

1. An automatic volume control system for a transistor amplifier provided with an amplifying transistor and a circuit therefor, input means to apply an input signal to said transistor circuit, output means to derive an amplified signal from said transistor circuit and a resistor-capacitor parallel bias network interposed in said circuit, said system comprising a control transistor having base, emitter and collector electrodes, said control transistor being effectively connected in series with said capacitor across said resistor, said collector electrode of said control transistor being connected solely to one end of said capacitor, rectifier and filter means coupled to said output means to derive a direct control voltage therefrom proportional to the volume level of the amplified signal and means to apply said control voltage to said control transistor to vary the impedance thereof accordingly and thereby to control the amplification factor of said amplifying transistor.

2. An automatic volume control system for a transistor amplifier provided with an amplifying transistor having a base and emitter and collector electrodes, input means to apply an input signal to said base relative to one of said electrodes, output means to derive an amplified signal from the other of said electrodes relative to said one electrode, and a resistor-capacitor parallel network interposed between said one electrode and said input and output means to apply bias to said one electrode, said system comprising a control transistor having base, emitter and collector electrodes, said control transistor being effectively connected in series with said capacitor across said resistor, said collector electrode of said control transistor being connected solely to one end of said capacitor, means to derive a control voltage from said amplifier proportional to the volume level of the amplified signal therein, and means to apply said control voltage to said control transistor to vary the impedance thereof accordingly.

3. An automatic volume control system for a transistor amplifier provided with an amplifying transistor having a base and emitter and collector electrodes, input means to apply an input signal to said base relative to one of said electrodes, output means to derive an amplified signal from the other of said electrodes relative to said one electrode, and a resistor-capacitor parallel network interposed between said one electrode and said input and output means to apply bias to said one electrode, said system comprising a control transistor having base, emitter and collector electrodes, said control transistor being effectively connected in series with said capacitor across said resistor, said collector electrode of said control transistor being connected solely to one end of said capacitor, rectifier and filter means coupled to said output means to derive a direct control voltage therefrom proportional to the volume level of the amplified signal, and means to apply said control voltage to said control transistor to vary the impedance thereof accordingly and thereby to control the amplification factor of said amplifying transistor.

4. An automatic volume control system for a transistor amplifier including an amplifying transistor having a base, an emitter and a collector, input means to apply an input signal to said base relative to said emitter, output means to derive an amplified signal from said collector relative to said base, and a resistor-capacitor parallel network interposed between said emitter and said input and output means to apply bias to said emitter, said system comprising a control transistor having base, emitter and collector electrodes, said control transistor being effectively connected in series with said capacitor across said resistor, said collector electrode of said control transistor being connected solely to one end of said capacitor, rectifier and filter means coupled to said output means to derive a direct control voltage therefrom proportional to the volume level of the amplified signal and means to apply said control voltage to said control transistor to vary the impedance thereof accordingly and thereby to control the amplification factor of said amplifying transistor.

5. A transistorized audio amplifier having an automatic-volume control system comprising a first amplifying stage including a transistor having a base, an emitter and a collector, means to apply an input signal to said base relative to ground, a resistor-capacitor parallel network connected between said emitter and to ground, an output amplifying stage coupled to said collector to derive the amplified signal from said first stage, a control transistor interposed between said capacitor and said resistor, the collector of said control transistor being connected solely to one end of said capacitor and the emitter thereof being connected to one end of said resistor, and means coupled to said output stage to derive a direct control voltage therefrom proportional to the volume level of the amplified signal and to apply said voltage to said control transistor to vary the impedance of said control transistor accordingly.

6. A transistorized audio amplifier having anautomatic-volume control system comprising a first amplifying stage including a transistor having a base, an emitter and a collector, means to apply an input signal to said base relative to ground, means to apply a negative potential to said collector relative to ground, a resistor-capacitor parallel network connected between said emitter and to ground, an output amplifying stage coupled to said collector to derive the amplified signal from said first stage, a control transistor interposed between said capacitor and said resistor, the collector of said control transistor being connected solely to one end of said capacitor and the emitter thereof being connected to one end of said resistor, and rectifier and filter means coupled to said output stage to derive a direct control voltage therefrom proportional to the volume level of the amplified signal and to apply said voltage to said control transistor to vary the impedance of said control transistor accordingly.

7. In a circuit provided with a resistor-capacitor network, means to control the reactance of said network comprising a control-transistor interposed between said capacitor and said resistor, and said transistor having a collector connected solely to one end of said capacitor and an emitter connected to one end of said resistor, and means to apply a control voltage to the base of said transistor.

References Cited in the file of this patent

UNITED STATES PATENTS

| | | |
|---|---|---|
| 2,307,308 | Sorensen | Jan. 5, 1943 |
| 2,323,634 | Van Slooten | July 6, 1943 |
| 2,544,211 | Barton | Mar. 6, 1951 |
| 2,576,145 | Rudkin | Nov. 27, 1951 |
| 2,786,964 | De Witt | Mar. 26, 1957 |

FOREIGN PATENTS

| | | |
|---|---|---|
| 216,799 | Australia | Aug. 20, 1958 |

OTHER REFERENCES

Shea: "Principles of Transistor Circuits," 1953, page 350.